(12) United States Patent
Sakurai

(10) Patent No.: US 7,939,874 B2
(45) Date of Patent: May 10, 2011

(54) SEMICONDUCTOR DEVICE

(75) Inventor: Hitomi Sakurai, Chiba (JP)

(73) Assignee: Seiko Instruments Inc. (JP)

( * ) Notice: Subject to any disclaimer, the term of this patent is extended or adjusted under 35 U.S.C. 154(b) by 525 days.

(21) Appl. No.: 12/012,716

(22) Filed: Feb. 5, 2008

(65) Prior Publication Data

US 2008/0197395 A1 Aug. 21, 2008

(30) Foreign Application Priority Data

Feb. 6, 2007 (JP) .................................. 2007-027005

(51) Int. Cl.
*H01L 27/108* (2006.01)
(52) U.S. Cl. ........ 257/300; 257/379; 257/380; 257/381; 257/E29.345
(58) Field of Classification Search .................. 257/300, 257/379, 380, 381, E29.345
See application file for complete search history.

(56) References Cited

FOREIGN PATENT DOCUMENTS

| | | |
|---|---|---|
| JP | 2002359293 | 12/2002 |
| JP | 2005109498 | 4/2005 |

*Primary Examiner* — Tan N Tran
(74) *Attorney, Agent, or Firm* — Adams & Wilks

(57) ABSTRACT

A semiconductor device has semiconductor elements formed on a silicon substrate. A first one of the semiconductor elements has a region formed with a surface orientation of <100>. A second one of the semiconductor elements has a region formed with a surface orientation of <110> or <111>. A third one of the semiconductor elements has a region formed with a surface orientation different from the respective surface orientations of the regions of the first and second semiconductor elements.

12 Claims, 2 Drawing Sheets

SEMICONDUCTOR DEVICE

BACKGROUND OF THE INVENTION

1. Field of the Invention

The present invention relates to a semiconductor device, and more particularly, to a CMOS device and a nonvolatile memory which are formed on a silicon semiconductor substrate.

2. Description of the Related Art

Conventionally, the following construction and structure have been used for complementary metal oxide semiconductor (CMOS) transistors, a MOS capacitor, and the like on a silicon semiconductor substrate.

First, as shown in FIG. 3, an NMOS transistor 40, a PMOS transistor 41, and a MOS capacitor 42 are formed on a desired portion of a silicon substrate 28 having a unique surface direction such as <100> or <110> through the application of known technology in which, for example, the NMOS transistor 40 includes a gate oxide film 32 made of a silicon oxide film and a gate electrode 35 made of polysilicon; the PMOS transistor 41 includes a gate oxide film 33 made of a silicon oxide film and a gate electrode 36 made of polysilicon; and the MOS capacitor 42 includes a lower electrode 31, a gate oxide film 34 made of a silicon oxide film, and a gate electrode 37 made of polysilicon on the surface of the silicon substrate 28. In FIG. 3, reference numerals 29, 30, 38 and 39 denote a diffused region for a P-type well, a diffusion region for an N-type well, a source/drain diffused region for the NMOS transistor 40, and a source/drain region for the PMOS transistor 41, respectively.

In each of the formed semiconductor elements such as NMOS transistor 40, PMOS transistor 41, and MOS capacitor 42, the same surface direction is applied to the channel region and the boundary surface between the silicon substrate and the silicon oxide film.

However, in general, the electron mobility is high in the <100> surface, whereas the hole mobility is reduced to one-quarter to one-half of the electron mobility. Further, in the <110> surface, the hole mobility becomes two times higher than that in the <100> surface, but the electron mobility remarkably deteriorates.

That is, when CMOS transistors are formed in the same surface direction, the driving ability of one of the NMOS transistor and the PMOS transistor deteriorates more than that of the other. In order to compensate the deterioration, the channel width of the transistor should be larger, which makes it difficult to miniaturize the transistor.

On the other hand, in order to adapt the CMOS structure without impairing the driving abilities of both NMOS transistor and PMOS transistor, two surface directions exist together in a silicon substrate, and there is adapted the structure in which the NMOS transistor is formed on the <100> surface and the PMOS transistor is formed on the <110> surface (For example, see JP 2005-109498 A and JP 2002-359293 A).

No matter whether in the case of a conventional structure for elements on a unique surface direction, or in the case where different surface directions are applied to an NMOS transistor and a PMOS transistor, the silicon substrate has a uniform and flat surface for a channel surface or a boundary surface of a gate oxide film.

A silicon oxide film formed on the flat surface of the silicon substrate has, however, many crystal distortions or dangling bonds on the boundary surface thereof, which causes the following problems, since the sizes of molecules constituting silicon single crystal and silicon dioxide are different.

1. When a gate oxide film is made much thinner so as to improve the driving ability of a transistor or miniaturize the transistor, influence of the crystal distortions on the boundary surface becomes remarkable, thereby deteriorating the dielectric strength characteristic and reliability of the gate oxide film.

2. Particularly in a MOS capacitor in which the surface of the silicon substrate is mainly used in the accumulation state, or in a tunnel oxide film of a nonvolatile memory, which is used to pass electrons and holes therethrough, the crystal distortion in the boundary surface has more remarkable influence on the characteristics and reliability thereof than those of the gate oxide film of the transistor, thereby making it difficult to miniaturize the semiconductor elements by thinning them.

SUMMARY OF THE INVENTION

An object of the present invention is to improve the structure of semiconductor elements and to eliminate the above-mentioned problems of the semiconductor elements formed on a silicon substrate.

In a semiconductor device according to the present invention, applying at least three different surface directions to different elements, at least characteristics sensitive to the surface direction can be independently determined as the best characteristic for each element in the characteristics required for each element.

As described above, in the present invention, at least three surface directions exist together in one chip, thereby obtaining the characteristics required for each element as the best characteristics without being affected by other characteristics, and reducing the size of the elements effectively.

DETAILED DESCRIPTION OF THE PREFERRED EMBODIMENTS

A first embodiment of the present invention will be described below.

Figure 1A:
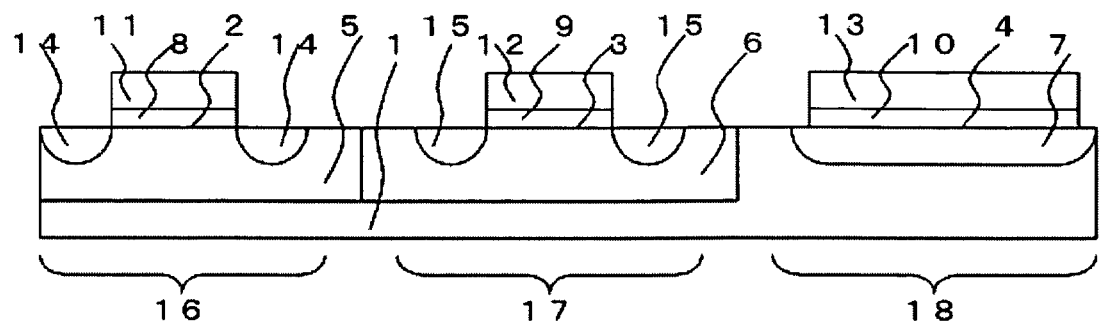
FIGS. 1A and 1B are explanatory diagrams according to a first embodiment of the present invention.

First, as shown in FIG. 1A, on a desired portion of a silicon substrate 1, there are formed an NMOS transistor 16, a PMOS transistor 17, and a MOS capacitor 18 by applying a known technology. For example, the NMOS transistor 16 includes a gate oxide film 8 made of a silicon oxide film and a gate electrode 11 made of polysilicon. The PMOS transistor 17 includes a gate oxide film 9 made of a silicon oxide film and a gate electrode 12 made of polysilicon. The MOS capacitor 18 includes a lower electrode 7, a gate oxide film 10 made of a silicon oxide film, and a gate electrode 13 made of polysilicon on the surface of the silicon substrate. The lower electrode 7 of the MOS capacitor 18 may be p-type or n-type, which does not change the effects described below. In FIG. 1A, reference numerals 5, 6, 9-10, 14 and 15 denote a diffused region for a P-type well, a diffused region for an N-type well, gate oxide films, a source/drain diffused region for the NMOS transistor 16, and a source/drain region for the PMOS transistor 17, respectively.

For the surface direction of the silicon substrate in this case, in order to ensure more satisfactory driving abilities of the transistors, the <100> surface having a high electron mobility is applied to at least a channel region 2 of the NMOS transistor, and the <110> surface or <111> surface having a high hole mobility is applied to at least a channel region 3 of the PMOS transistor. Consequently, both of the NMOS transistor and the PMOS transistor can maintain high driving abilities and need not to ensure the channel width thereof more than necessary.

Figure 1B:
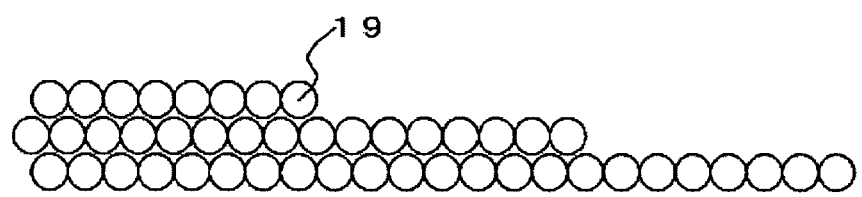

In the majority of semiconductor devices, not only transistors but also a plurality of elements is mounted together on one chip. Thus, when the MOS capacitor is mounted together as shown in FIG. 1A, a surface direction inclined by 1 to 4 degrees from the <100> surface toward the <010> surface is applied to at least a silicon substrate 4 which is just below the gate forming the capacitor. The surface of the silicon substrate, which is inclined by 1 to 4 degrees from the <100> surface, is not a uniform and flat surface unlike the <100> surface and the <110> surface themselves described above. As shown in FIG. 1B, the cross section of the surface of the silicon substrate exhibits a step structure in which steps are formed by layers of silicon atoms 19.

With this structure, particularly for a silicon thermal oxide film formed on the surface of the silicon substrate, the crystal distortion derived from the difference between the molecular sizes of the silicon substrate and the silicon dioxide film in the boundary surface thereof is mitigated because the atomic distance of silicon is large in the step portion of the substrate, thereby improving the dielectric strength, the reliability, and the like of the silicon oxide film. Accordingly also in the MOS capacitor, a silicon oxide film which is to be a gate oxide film is easily made thinner, and reduction in area thereof is enabled without impairing the characteristics.

The gate oxide film of the transistor and that of the MOS capacitor are the same in the fundamental structure. The gate oxide film of the MOS capacitor and that of the transistor are formed with the same films, or formed in the same process in many cases.

In the embodiment described above, the surface inclined by 1 to 4 degrees is not applied to the channel region of the transistor, that is, the portion on which the gate oxide film is formed. However, unlike the MOS capacitor mainly used in accumulation state, the gate oxide film portion of the transistor which is used in inversion state has less electrical stress than the MOS capacitor, and has higher withstanding voltage and reliability even with the same film thickness. Even when the gate oxide film is made thinner so as to miniaturize the MOS capacitor and the same film is applied to the gate oxide film of the transistor, transistor characteristics including gate insulation property and the reliability are not limited.

Further, when the surface inclined by 1 to 4 degrees is applied to the channel region of the transistor, which is not shown specifically, the crystal distortion in the boundary surface of the gate oxide film is mitigated. As a result, as well as improving the dielectric strength voltage and reliability of the gate oxide film, the scattering of carriers such as electrons and holes in the boundary surface of the channel region is suppressed, thereby reducing 1/f noise. Such structure as described above is suitable for a high-accuracy analog circuit element, and exhibits a great effect particularly in a surface channel transistor. For example, at least a channel region of NMOS transistor may be set to the surface direction inclined by 1 to 4 degrees from the <100> surface. In this case, in addition to the reduction of the 1/f noise of the transistor, improvement in film quality of the gate oxide film can be achieved.

As described above, even in the semiconductor device made only of MOS transistors, at least three surface directions are applied to the transistors according to the characteristics required for each transistor, thereby effectively achieving the best characteristics of the semiconductor device.

Next, a second embodiment of the present invention, in which the present invention is applied to a semiconductor nonvolatile memory, will be described below.

A nonvolatile memory cell generally employs the mechanism of rewriting data by injecting electric charges into a floating gate portion, and holding the data. In this case, the silicon substrate side and the floating gate formed of polysilicon or the like of the cell for exchanging electric charges, between which the electric charges are exchanged, are isolated by a thin thermally oxidized silicon film. Rewrite of the data is conducted by passing the electric charges through the silicon oxide film.

Accordingly, the number of rewriting in a memory cell, data retention characteristic, and the like depend on largeness of the dielectric strength of an oxide film through which electric charges are exchanged and on smallness of traps and defects. Such a factor that defines the characteristics of a silicon oxide film is crystal distortion in the boundary surface between the silicon substrate and the silicon oxide film. As the silicon oxide film becomes thinner, the influence of crystal distortion on the boundary surface becomes greater.

Figure 2:
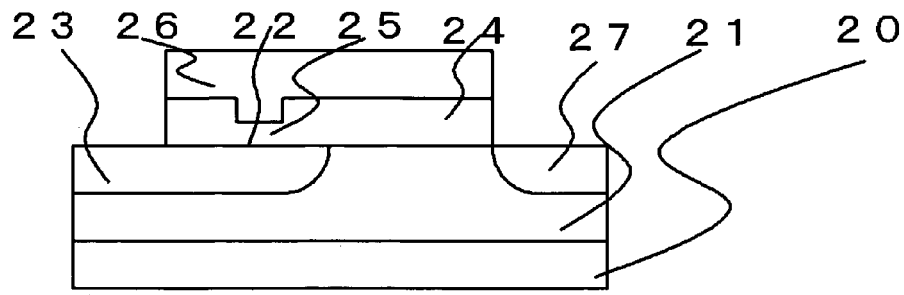
FIG. 2 is an explanatory diagram according to a second embodiment of the present invention.
Figure 3:
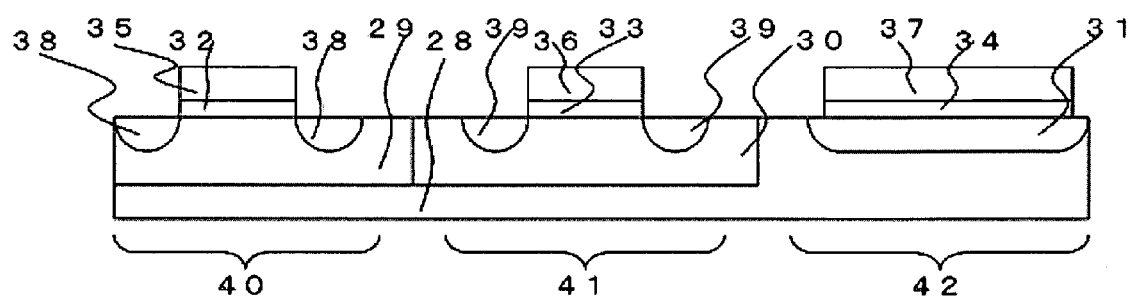
FIG. 3 is an explanatory diagram of a conventional technology.

For example, in an EEPROM cell as shown in FIG. 2, the surface direction inclined by 1 to 4 degrees from the <100>surface toward the <010>surface is applied to a formation region 22 of a tunnel oxide film 25 made of a silicon oxide film, in which electric charges are exchanged with at least a floating gate 26. In FIG. 2, reference numerals 20, 21, 23, 24 and 27 denote a silicon substrate, a diffused region for a P-type well, a drain diffused region for a memory cell, a gate oxide film, and a source diffused region for a memory cell, respectively.

The surface direction inclined by 1 to 4 degrees is not a uniform and flat surface as described in the first embodiment of the present invention. The surface direction has the step structure in which silicon atomic layers form steps, so the crystal distortion in the boundary surface between the silicon substrate and the silicon oxide film is mitigated in the step portion, thereby improving the quality of the tunnel oxide film.

Accordingly, in addition to improvement on the characteristics of the memory cell, the tunnel oxide film is easily thinned without causing deterioration of the quality thereof. As a result, it is possible to make a voltage for writing data lower and make peripheral circuit transistors including the cell smaller.

Note that a nonvolatile memory device can not be completed by a single memory cell but includes CMOS transistors and various elements for such a circuit as to drive the cell. Hence, by providing a semiconductor device including on a chip the memory cell, an NMOS transistor having a channel region of the <100> surface, a PMOS transistor having a channel region of the <110> surface, and the like, a semiconductor device on which at least three surface directions coexist, the best characteristics of the elements can be obtained effectively.

In this case, as a gate electrode of the memory cell, only the floating gate is shown in the figure. A control gate electrode for controlling the floating gate may be formed, for example, by forming on the floating gate a second polysilicon gate which is capacitively coupled to the floating gate through the silicon oxide film etc. Alternatively, the control gate electrode may be formed as an interconnecting diffusion layer in the silicon substrate.

There is a nonvolatile memory cell which does not have a tunnel oxide film region and into which electric charges are injected from a drain end portion of the gate oxide film in the cell transistor. However, as in the aforementioned embodiment, when the surface direction inclined by 1 to 4 degrees from the <100> surface toward the <010> surface is applied to at least the boundary surface of the gate oxide film in the drain end portion in which the electric charges are exchanged, the same effect can be obtained.

In FIG. 2 of this embodiment, the NMOS memory cell is given as a representative example. However, even when the present invention is applied to a PMOS memory cell structure, the same effect can be obtained.

In addition, the silicon surface direction has characteristics in which the <110> surface has a small thermal stress and the <111> surface is hard to oxidize. Therefore, an ohmic contact between a conductive part formed on a silicon substrate or a substrate and an upper metal wiring can be easily established, whereby the silicon surface direction is suitable for reduction in source/drain parasitic resistance of a transistor or for a resistance element with high accuracy.

By mixing at least three surface directions on a single device, in which each element has a different surface direction, a semiconductor device provided with the best characteristics can be obtained.

In order to form a plurality of surface directions on a chip or a wafer, there are employed a technique of performing selective surface direction etching several times and a technique of directly bonding silicon substrates different from each other in surface direction. Further, the different surface directions which are applied to a transistor or a semiconductor device need not to exist in the same plane of a chip or a wafer. Even when the different surface directions are three-dimensionally formed in a surface so as to be obtained from a single crystal, the effect of this embodiment is not impaired.

What is claimed is:

1. A semiconductor device comprising: a plurality of semiconductor elements formed on a silicon substrate, a first one of the semiconductor elements having a region formed with a surface orientation of <100>, a second one of the semiconductor elements having a region formed with a surface orientation of <110> or <111>, and a third one of the semiconductor elements having a region formed with a surface orientation different from the respective surface orientations of the regions of the first and second semiconductor elements.

2. A semiconductor device according to claim 1; further comprising a silicon oxide film formed on the silicon substrate; and wherein at least a part of a boundary surface between the silicon substrate and the silicon oxide film used to pass electrons and holes therethrough is formed with the same surface orientation as that of the region of the third semiconductor element.

3. A semiconductor device according to claim 2; wherein the boundary surface between the silicon substrate and the silicon oxide film is inclined by 1 to 4 degrees from the <100>surface orientation toward a surface orientation of <010>.

4. A semiconductor device according to claim 1; wherein the surface orientation of the region of the third semiconductor element is inclined by 1 to 4 degrees from the <100>surface orientation toward a surface orientation of <010>.

5. A semiconductor device comprising:
   an NMOS transistor formed on a silicon substrate and having a channel region formed with a surface orientation of <100>;
   a PMOS transistor formed on the silicon substrate and having a channel region formed with a surface orientation of <110> or <111>; and
   a MOS capacitor formed on the silicon substrate and having a gate electrode and at least a region just below the gate electrode that is formed with a surface orientation different from that of the channel region of each of the NMOS transistor and the PMOS transistor.

6. A semiconductor device according to claim 5; further comprising a silicon oxide film formed on the silicon substrate; and wherein at least a part of a boundary surface between the silicon substrate and the silicon oxide film used to pass electrons and holes therethrough is formed with the same surface orientation as that of the region of the MOS capacitor.

7. A semiconductor device according to claim 6; wherein the boundary surface between the silicon substrate and the silicon oxide film is inclined by 1 to 4 degrees from the <100>surface orientation toward a surface orientation of <010>.

8. A semiconductor device according to claim 5; wherein the surface orientation of the region of the MOS capacitor is inclined by 1 to 4 degrees from the <100>surface orientation toward a surface orientation of <010>.

9. A semiconductor device comprising: an NMOS transistor having a channel region formed with a surface orientation of <100>; a PMOS transistor having a channel region formed with a surface orientation of <110> or <111>; and a memory cell having a region formed with a surface orientation that is inclined by 1 to 4 degrees from the <100>surface orientation toward a surface orientation of <010>.

10. A semiconductor device according to claim 9; wherein the region of the memory cell comprises a formation region of a tunnel oxide film of the memory cell.

11. A semiconductor device according to claim 10; wherein the tunnel oxide film comprises a silicon oxide film.

12. A semiconductor device according to claim 9; wherein the region of the memory cell comprises at least a boundary surface of a gate oxide film in a drain end portion in which electric charges are exchanged.

* * * * *